United States Patent [19]
Dunnam

[11] Patent Number: 5,469,058
[45] Date of Patent: Nov. 21, 1995

[54] FEEDBACK ENHANCED SENSOR, ALTERNATING MAGNETIC FIELD DETECTOR

[76] Inventor: Curt Dunnam, 5244 Perry City Rd., Trumansburg, N.Y. 14886

[21] Appl. No.: 998,965

[22] Filed: Dec. 30, 1992

[51] Int. Cl.$^6$ .................................................. G01R 33/02
[52] U.S. Cl. ............................................................ 324/258
[58] Field of Search ...................................... 324/253, 254, 324/255, 258, 262, 244, 249, 260, 261

[56] References Cited

U.S. PATENT DOCUMENTS 3,546,580  12/1970  Williams .................................. 324/258
3,872,382  3/1975  Bertram et al. ......................... 324/258

Primary Examiner—Walter E. Snow
Attorney, Agent, or Firm—Salzman & Levy

[57] ABSTRACT

The present invention features an active sensor for detecting a magnetic field. The sensor includes a pickup coil wound on a semi-flexible bobbin, which in turn is mounted on a suitable core assembly. Optionally, the core/coil assembly can then be mounted on a flexible substrate. Thin strips of either standard or amorphous crystalline high-permeability alloy are laminated to form the core. Once the coil has been assembled with the core laminations, output leads from the coil are connected to conductors of a miniature coaxial cable, the sheath of which is grounded to the core laminations. An operational amplifier is connected to the coil assembly. The operational amplifier has a positive feedback path to substantially cancel the combined dissipative loss of resistance and core eddy currents of the coil assembly. The operational amplifier also has a negative feedback path to set the maximum gain of the active sensor.

16 Claims, 6 Drawing Sheets

FEEDBACK ENHANCED SENSOR, ALTERNATING MAGNETIC FIELD DETECTOR

RELATED PATENT APPLICATION

The present patent application is related to U.S. patent application Ser. No. 07/998,970, assigned to the present assignee, for "Active Feedback System for Suppression of Alternating Magnetic Fields", filed Dec. 30, 1992, and is hereby incorporated by reference.

BACKGROUND OF THE INVENTION

The present invention relates to magnetic field sensors and, more particularly, to feedback enhanced sensors capable of detecting time-varying and/or alternating magnetic fields.

Time-varying magnetic fields are often generated by a.c. mains wiring and associated distribution transformers. Occasionally, switching high current d.c. circuits or moving d.c. powered equipment and vehicles or even movement of large ferromagnetic bodies in the earth's geomagnetic field can generate time-varying magnetic fields.

Such magnetic fields may be troublesome. For example, prolonged exposure to even milligauss magnetic disturbances may result in danger to the health of humans and animals. A recent Swedish study, for example, was reported at a conference sponsored by the U.S. Department of Energy and the Electric Power Research Institute. The study indicated that children exposed to relatively weak magnetic fields from power lines near their homes develop leukemia at almost four times the expected rate. Another found that men exposed to similar magnetic field levels in the workplace had three times the expected rate of one form of leukemia.

Moreover, uncontrolled magnetic fields may adversely affect sensitive equipment. For example, electron microscope resolution has been known to deteriorate when spurious magnetic fields are present.

While certain passive shielding mechanisms, notably those fabricated from "mu-metal" materials, can isolate sensitive equipment or personnel from magnetic fields, such mechanisms are generally intended only to protect limited areas. As a practical matter, it has proven to be impossible to compensate for magnetic disturbances, at a reasonable cost, for volumes of space as great as a room, much less a building.

A key element of an a.c. magnetic field protection system is the mechanism used to detect the alternating, low frequency magnetic field. Heretofore, sensors adapted to detect a.c. magnetic fields have been limited in dynamic range and/or have been too costly and/or exhibit, across the frequency band of interest, electrical characteristics which preclude successful closed-loop operation.

Hall-effect sensors exhibit intrinsic frequency response from d.c. to many tens of megahertz, but are typically limited to a minimum field resolution of 50 nanoteslas (500 µgauss) because of low output signal voltage and consequently poor signal/noise ratio. By contrast, compensation of workplace or laboratory a.c. magnetic fields implies a sensor root-mean-square (r.m.s.) noise floor at least 10 dB below the compensated field level. In systems intended for personnel protection or shielding of sensitive electronic apparatus, it is desirable that ambient fields be reduced to 10 nanoteslas (100 µgauss) or less. That capability requires a sensor noise "floor" of at least 3 nanoteslas (30 µgauss) for successful closed-loop negative feedback operation. Because the Hall-effect sensor noise floor is well above that level, Hall-effect devices are not useful as sensors in a high-attenuation negative feedback a.c. magnetic field compensation system.

Flux-gate and second-harmonic magnetometers typically exhibit d.c. to several kilohertz frequency response and have a noise floor of around 1 nanotesla (10 µgauss), r.m.s., but such devices are relatively costly. The high cost is due to the criticality of the core material's characteristic and physical placement of the core windings, and the complexity of the associated electronic system.

Switchmode magnetometers also exhibit a constant phase shift vs. frequency (equivalent to an appreciable, fixed propagation delay) which severely limits maximum attainable stable closed-loop field attenuation in an active feedback system.

It would be advantageous to provide a feedback-enhanced sensor having low-noise performance equal to or better than that of switchmode magnetometers at a cost which is lower than Hall-effect devices with low-noise preamplification. In effect, unneeded d.c. response may be traded off for lower cost and better noise performance in the feedback-enhanced sensor.

U.S. Pat. No. 4,939,451 issued to Baran et al on Jul. 3, 1990, discloses a high power, a.c. current sensor, used to detect and measure current and power. A current shunt is provided, along with a current transformer and a low-impedance burden load. Two operational amplifiers are used in one of the embodiments to provide a current summing device.

It would be advantageous to provide a sensor for detecting a magnetic field in frequencies of an extended range between millihertz and tens of megahertz.

It would also be advantageous to provide a sensor with an adjustable time constant, so that the sensor's low frequency cutoff point can be optimally adjusted for a given coil/core combination.

It would also be advantageous to provide a sensor having a minimum number of components.

It would also be advantageous to provide a sensor having improved sensitivity, so that a biological experiment or electrical device could be protected against a.c. magnetic fields with little or no exposure thereto.

SUMMARY OF THE INVENTION

In accordance with the present invention, there is provided an active sensor for detecting a magnetic field. The sensor includes a pickup coil wound on a semi-flexible bobbin, which in turn is mounted on a suitable core assembly. The core/coil assembly is then mounted on a flexible substrate. Thin strips of either standard or amorphous crystalline high-permeability alloy are laminated to form the core. Once the coil has been assembled with the core laminations, output leads from the coil are connected to conductors of a miniature coaxial cable, the sheath of which is grounded to the core laminations. An operational amplifier is connected to the coil assembly. The operational amplifier has a positive feedback path to substantially cancel the combined dissipative loss of resistance and core eddy currents of the coil assembly. The operational amplifier also has a negative feedback path to set the maximum system gain (sensitivity) of the active sensor.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

Figure 1A:
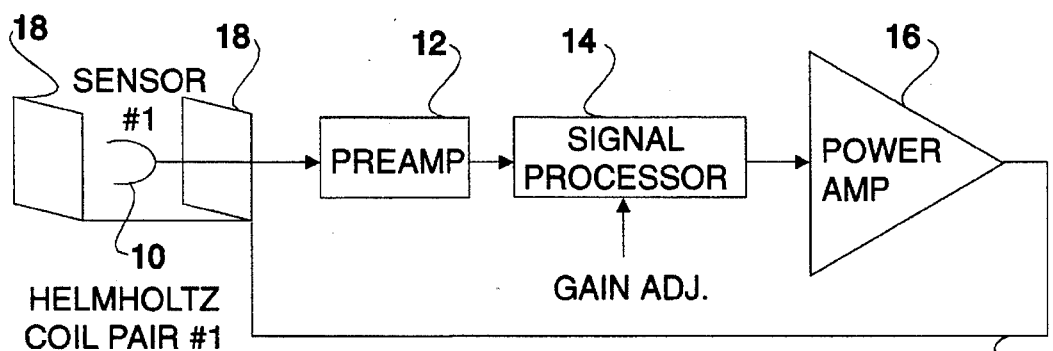
FIGS. 1a, 1b and 1c are simplified block diagrams of the feedback enhanced sensor and a typical mechanism for suppressing a magnetic field in each of three orthogonal planes, respectively, in accordance with the present invention.
Figure 1B:
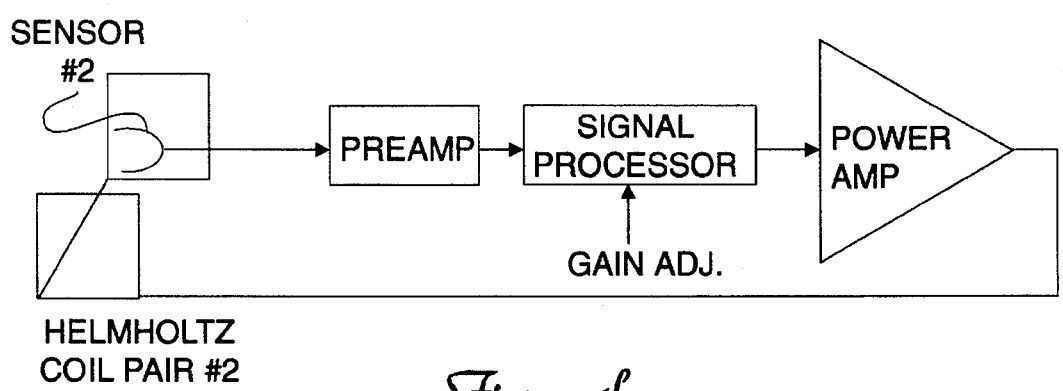
Figure 1C:
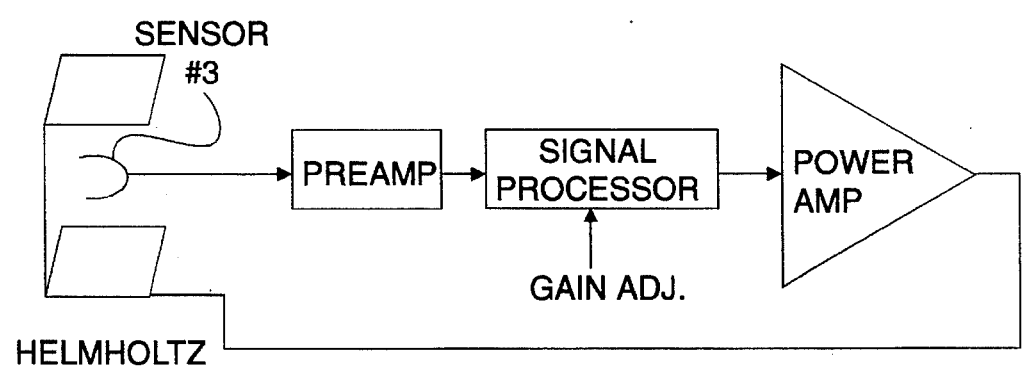

Referring now to FIGS. 1a, 1b and 1c, there are shown simplified block diagrams of an active feedback system for suppressing a magnetic field in each of three orthogonal planes, respectively, the system being typical of many capable of utilizing the sensor of the present invention. A separate channel X, Y and Z is used for each of the orthogonal planes. Since all three channels have the same structure and function, in the interest of brevity only one channel X is discussed in greater detail herein.

Two channels X and Y are typically used for protection of electron microscope sites and similar applications where only magnetic flux components perpendicular to the electron beam axis need be compensated. However, personnel safety and biological experimentation applications typically require three-axis X, Y and Z protection.

A magnetic sensor 10 is provided and is described in greater detail hereinbelow with respect to FIG. 3. Connected to magnetic sensor 10 for receiving a signal generated thereby is a preamplifier 12, to which is connected a signal processor 14, described in greater detail hereinbelow. A power amplifier 16 of suitable bandwidth and drive capability is connected to signal processor 14. A pair of Helmholtz drive coils (compensation coils) 18 is adapted to receive a relatively high-power correction signal generated by power amplifier 16. Compensation drive coils 18 can be any suitable size and can be placed in any suitable position relative to sensor 10 to accommodate the volume of space to be protected from magnetic fields. Ideally, compensation drive coils 18 are installed at the vertices of the room containing the instrument or experiment to be protected from stray a.c. fields. Generally, system performance is enhanced with increasing distance from the compensation drive coils 18 to the magnetic sensor 10. Proper phasing of the individual coils in each Helmholtz pair 18 is also essential to proper operation of the system. For these coil sets, each coil's field vector, as seen at the coil center, must point in the same direction. Each pair of coils 18 consists of two of the individual coils, one in/on each facing wall of the room, or one in/on the ceiling and one in/on the floor of the room or two similarly spaced parallel planes.

In operation, one orthogonal component, say X, of the target field occurs when the signal originating at magnetic sensor 10 is amplified and fed back over line 17 to compensation coils 18, with suitable magnitude and phase over the frequency band of interest. By applying direct negative feedback, in lieu of a derived servo error (as has been the practice in the prior art), system signal processing requirements are simplified and compensation bandwidth is increased.

In a negative feedback system, signal processing is limited to compensation of magnitude and phase shift attributable to various elements of the loop. Contributing elements include the sensor itself, the power amplifier and the inductive component of the drive coils. Compensation for unwanted phase shift in the negative-feedback configuration enhances closed-loop gain and, hence, the maximum (magnetic field) attenuation-bandwidth product of the system.

By contrast, a field-compensation servo system develops a time-averaged error signal representing the difference between a compensating signal and the ambient field. The resultant error signal is integrated and used to adjust the level of a d.c. source or low-frequency waveform generator. The necessity of an integrator in the servo configuration limits the effective bandwidth with respect to a direct negative feedback configuration, assuming both systems utilize similar sensor and driver/coil components. Servo-like systems are best suited to nulling d.c. fields, where the large, effective d.c. gain of the servo's integrator ensures a vanishingly small d.c. error term.

Although the principle of negative feedback is well known in electrical engineering, a practical field compensation system requires a coherent user control interface and resolution of many secondary engineering details, not all of which are necessary to practice the instant invention.

Figure 2:
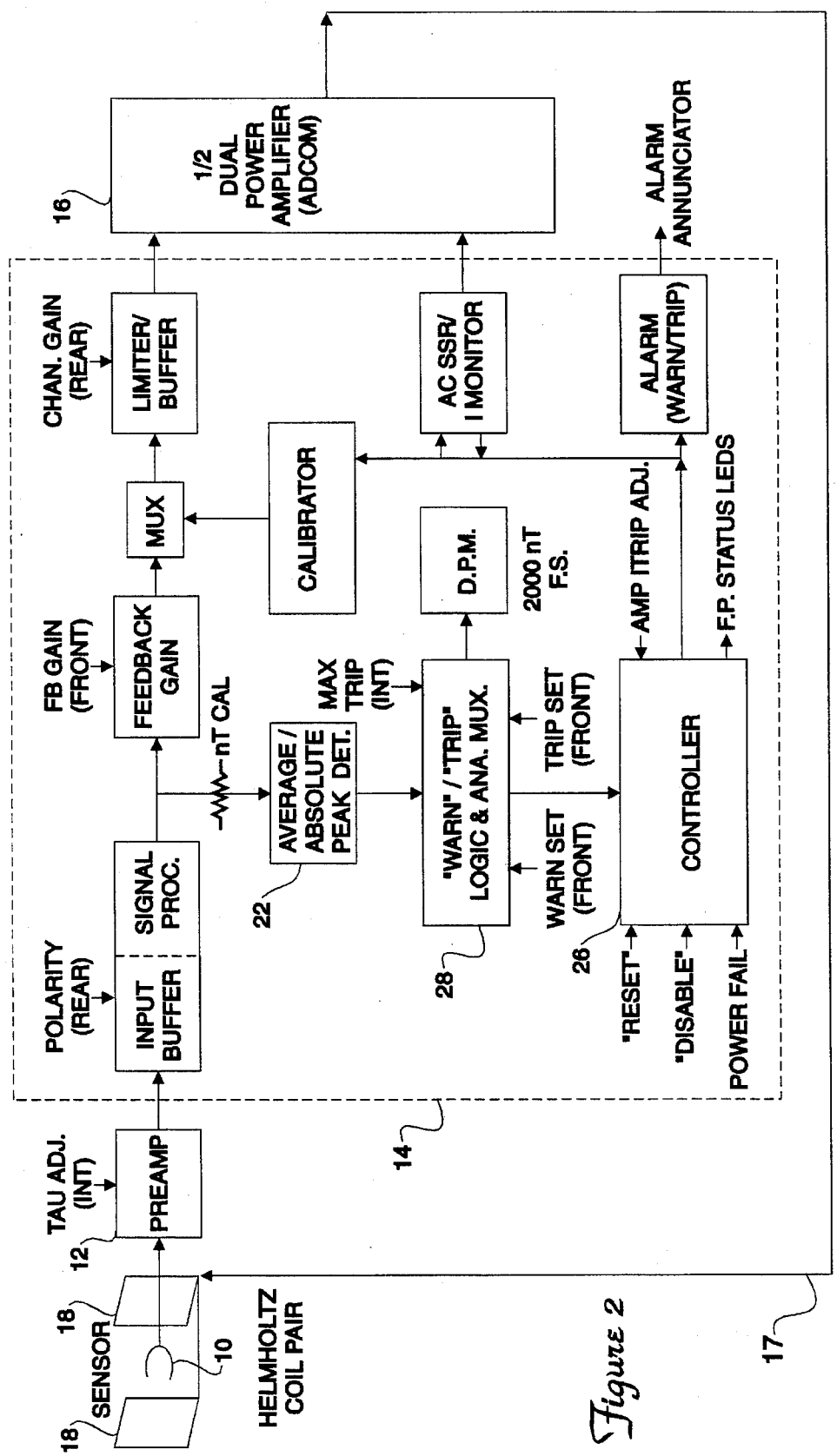
FIG. 2 is a more detailed block diagram of the protection circuit shown in one of the three planes depicted in FIGS. 1a, 1b or 1c.

Referring now also to FIG. 2, there is shown a more detailed block diagram of the signal processor 14 (FIG. 1a) in the X-plane. Time-varying magnetic fields in the frequency passband of the magnetic sensor 10 are converted to electrical signals, which are amplified by preamplifier 12. Positive feedback produces a negative input impedance in preamplifier 12 to cancel most of the sensor coil resistive component.

Figure 3:
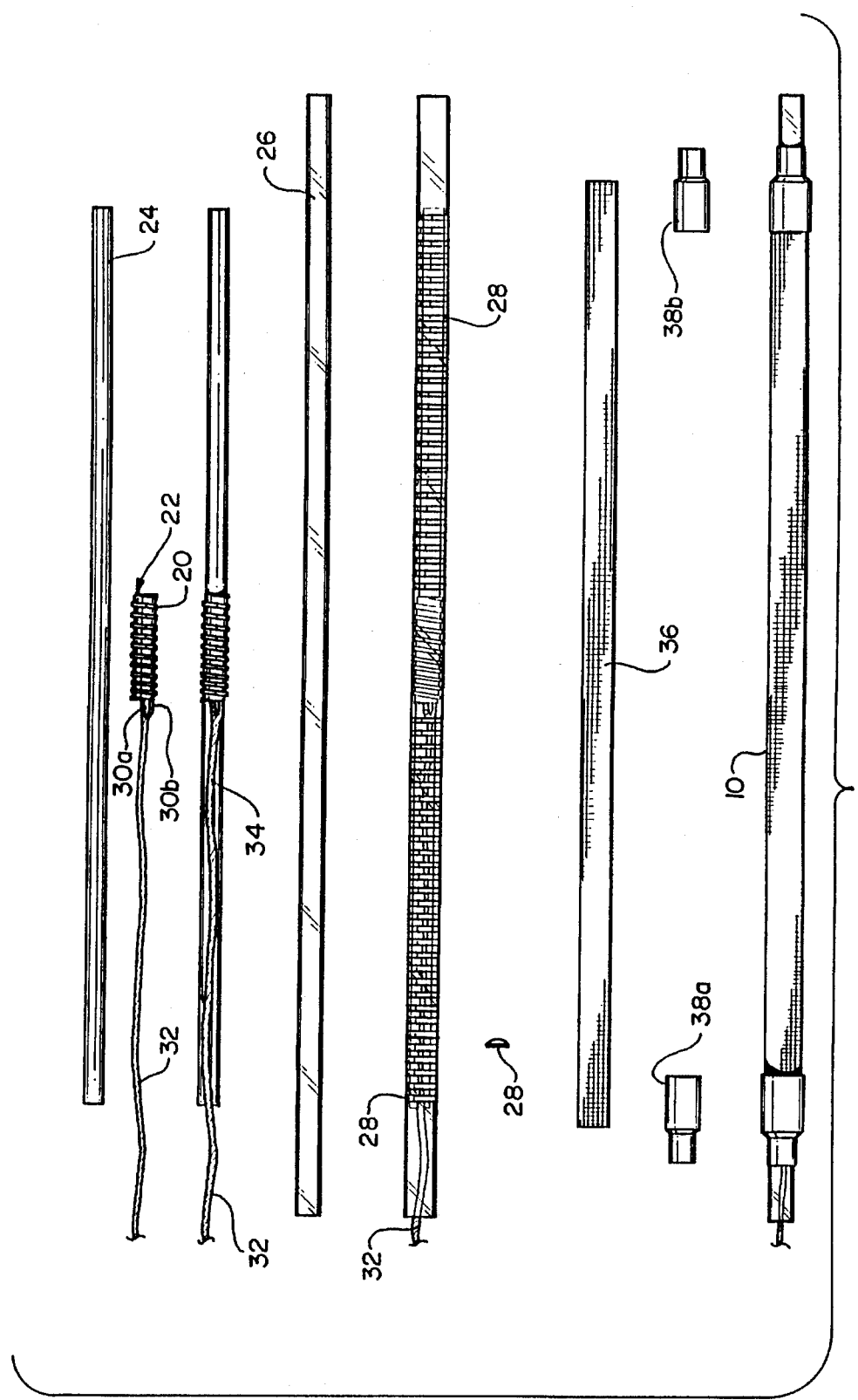
FIG. 3 is an exploded view of the sensor assembly.

Referring now also to FIG. 3, there is shown an exploded view of the components and assembly steps in the preferred embodiment of a coil assembly of the magnetic sensor 10. Sensor coil 20 comprises a pickup coil wound on a semi-flexible bobbin 22, which in turn is mounted on a suitable core assembly 24. The core/coil assembly 24 is then mounted on a flexible Lexan substrate 26 with heat shrink sliding hold-downs 28 in a manner, well known in the art, which avoids stressing the core material 24 when the sensor assembly 10 is flexed. A flexible sensor assembly allows installation on the columns of electron microscopes or the like. In most installations, the sensor may remain in a flat, non-flexed configuration.

Thin (1 to 75 μm) 1 cm wide strips of either standard or amorphous crystalline high-permeability alloy are laminated to form the core 24. The thickness of the electrically-conductive strips determines the intrinsic high frequency rolloff point. The strips may be any length up to several meters. A 270° "wrap-around" has been found to maximize orthogonality between the two column-mounted (X-plane, Y-plane) sensors needed for electron microscopy applications. Other geometries are, of course, possible and should not be considered outside the scope of the present invention.

For sensors used in electron microscopy ambient field suppression, a 200-turn coil assembly 20 has been shown to be the best compromise between coil stray capacitance and low frequency stability margin.

Once the coil 20 has been assembled with the core laminations 24, output leads 30a and 30b from the coil 20 are connected to conductors of a miniature 50-ohm coaxial cable 32, such as type RG-174/U, the sheath 34 of which is grounded to the core laminations 24. By grounding the core 24, capacitive coupling of ambient electrostatic fields into the preamplifier 12 (FIG. 2) is minimized. A Faraday shield may also be incorporated into the sensor design, if required. The coaxial line 32, which may be up to two meters in length, terminates in a detachable connector, not shown, at the preamplifier module 12.

The entire sensor assembly, comprising coil 20, pickup coil and bobbin 22, core 24, substrate 26, heat shrink sliding hold-downs 28, and coaxial cable 32 is inserted in a woven fiberglass protective outer cover 36, secured by heat shrinkable end caps 38a and 38b.

Figure 4:
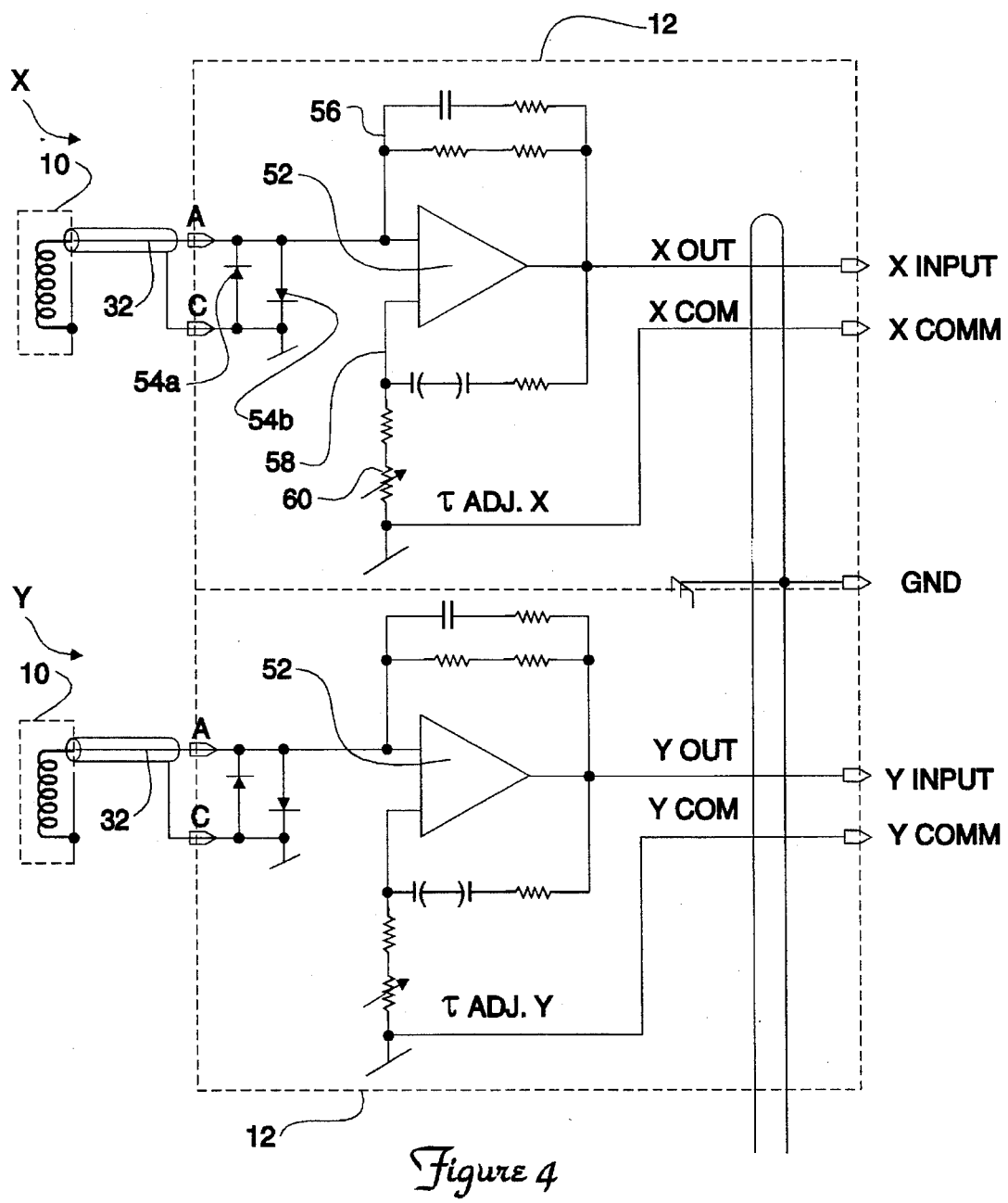
FIG. 4 is a schematic diagram of two magnetic sensors and associated preamplifiers in accordance with the present invention.

Referring now also to FIG. 4, there is shown a schematic diagram of magnetic sensor 10 and preamplifier 12 in greater detail, for channels X and Y. It should be understood, however, that either channel can be operated independently, if desired, and that a third channel Z, representing the magnetic field orthogonal to the X-Y plane, could be added without departing from the scope of the invention.

The 50-ohm coaxial cable 32 is used to apply the signal generated by magnetic sensor 10 to preamplifier 12, via connector A-C. Specifically, the signal supplied by cable 32 is connected to a low-noise operational amplifier 52 at the inverting input thereof. Two shunt diodes 54a and 54b prevent damage to the input of amplifier 52 in the case of inadvertent electrostatic discharge during installation. Diodes 54a and 54b are normally inert during operation of the sensor system. In the preferred embodiment, an input signal of 4.8 mV (which is a signal level well below the 0.5V conducting levels of diodes 54a and 54b) causes full-scale output from the preamplifier, 12.

Negative feedback loop 56 sets the maximum gain of the preamplifier/sensor combination through the passband of the sensor system. Positive feedback loop 58 provides the amplifier 52 with an input impedance having a negative real part, which substantially cancels the combined dissipative loss of the coil resistance and core eddy currents of the sensor coil 10. A negative-valued input resistance is obtained when a high gain operational amplifier stage is nested within the two feedback loops.

Figure 5:
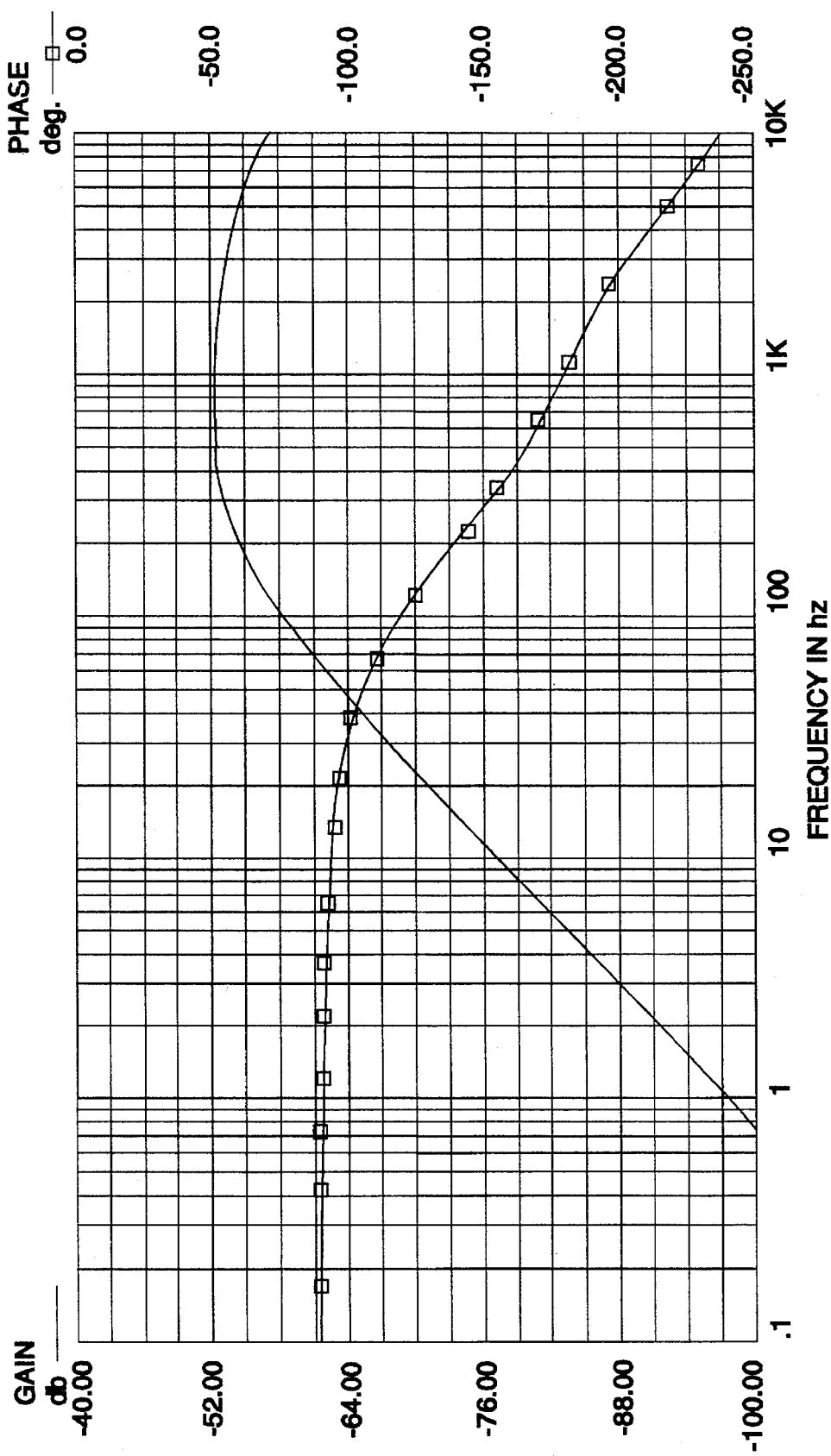
FIG. 5 is a graph depicting expected sensor/preamplifier response without compensation or positive feedback.
Figure 6:
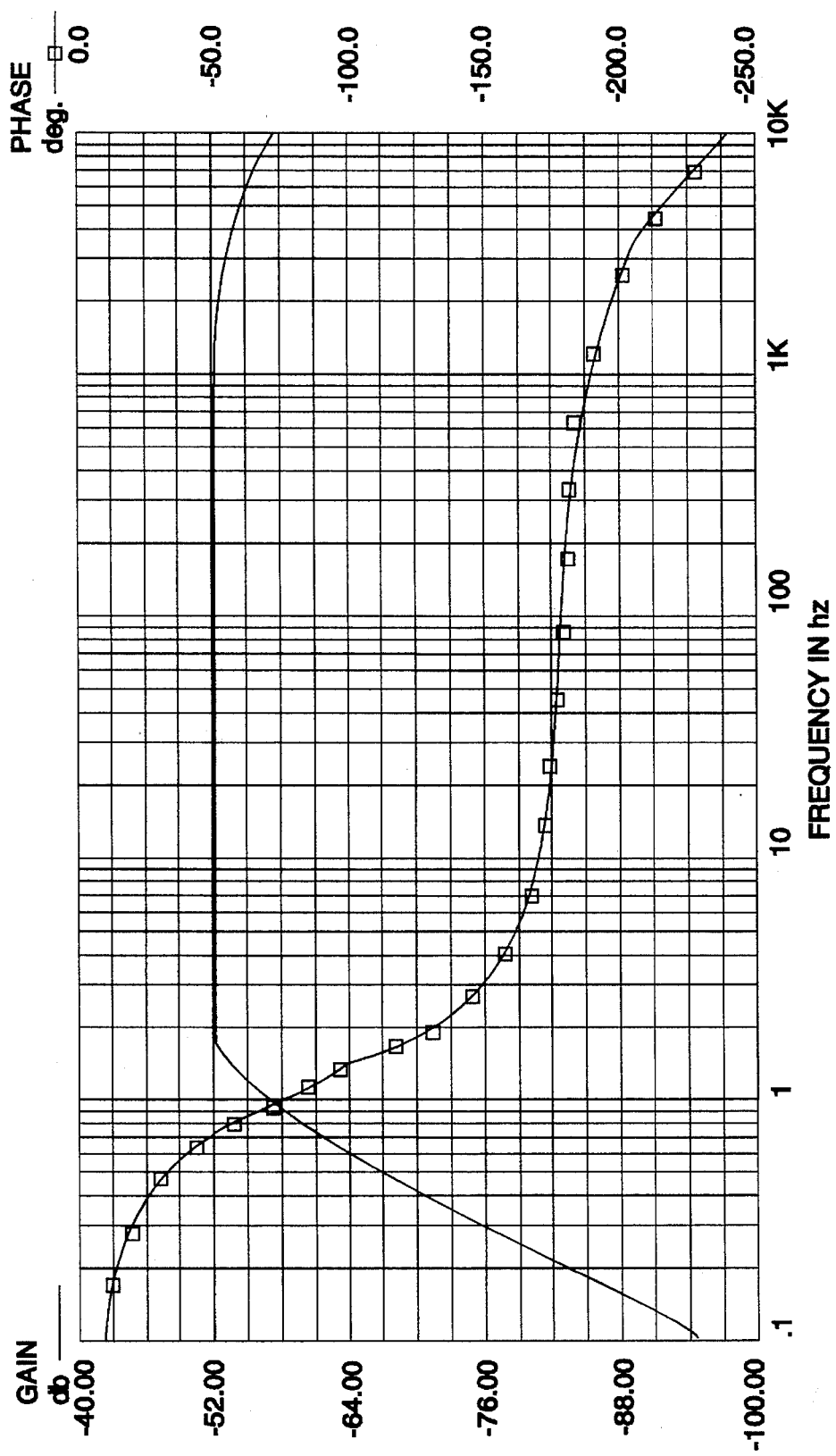
FIG. 6 is a graph depicting expected response of a sensor/preamplifier combination having optimum positive feedback.

Referring now to FIG. 5, there is shown a graph of a magnitude and phase response of a system without compensation or positive feedback. A complementary feedback mode (positive and negative feedback loops) causes the overall sensor to achieve significantly improved results, as shown in FIG. 6. In fact, such results would otherwise be expected only from a nearly-superconducting pickup coil/core assembly.

Several advantages accrue from this mode of operation, including increased bandwidth due to greater L/R ratio increased sensitivity due to lower coil losses, a lower noise floor due to suppression of the Johnson noise term associated with the coil's resistance, and reduction of Barkhausen noise associated with thermally-induced core magnetic domain transitions.

Barkhausen (so-called "1/f") noise is reduced somewhat, probably because core material macro-domain switching is inhibited by counter-currents induced in the sensor coil. These currents exhibit a much longer time constant than in the case of a coil with a resistive component equivalent to its winding resistance. Thus, in the added low-frequency bandwidth attributable to the negative input impedance of the preamplifier, these larger domain transitions are suppressed. The net reduction in 1/f noise is on the order of 10% or so. Interestingly, this behavior is exactly that expected if the whole sensor (but not the preamplifier) were cooled to cryogenic temperatures.

The low output impedance of the operational amplifier 52 also permits long output cable runs (up to 30 m) to the remotely-located signal processor 14 (FIG. 1a).

A potentiometer 60 in the positive feedback loop 58 is used to match the operational amplifier 52 to the sensor coil 10. Due to manufacturing variations of the core of coil 10, adjustment of the range of pickup can be made during setup. Additional adjustable trim elements may be added to set either gain or offset voltage of the sensor precisely, if needed. The primary "tau" adjustment directly affects the effective pickup/preamplifier time constant, which in turn determines the low frequency cutoff point of the sensor.

A normal installation with large ferromagnetic objects in the protected volume will typically exhibit 35 dB field suppression. When magnetic pick-up coils 10 are mounted on an electron microscope column and the Helmholtz coils 18 are properly positioned at the periphery of the electron microscope volume, the a.c. mains induced fields are suppressed by 20 dB to 40 dB over a frequency range of 10 Hz to 1 kHz. In the laboratory, field attenuation of approximately 54 dB has been achieved. In the context of a typical electron microscope site installation, where only 14 dB of field reduction is required, the minimum field attenuation of 30 dB provides a very conservative margin of security.

Field attenuation of at least 26 dB may be obtained for a.c. field components in the range of 0.001 Hz to 10 kHz over an unlimited volume of space. Rooms or buildings greater than approximately 40 m$^3$ may be protected by subdivision into independent protected sections, the maximum size of each being determined by the gradient of the incident field.

Although the field attenuation is constant, the maximum field which may be compensated is a function of output drive power and geometry of the coils 18. Test data indicate that incident field levels to 100 milligauss may be compensated with driver output power on the order of 50 watts per channel.

Frequency ranges of interest are typically 10 Hz to 1 kHz for compensation of power line magnetic fields in electron microscopy, personnel safety, biological and electronic instrument calibration applications, and 0.001 Hz to 1 kHz for protection of nuclear magnetic resonance (NMR) devices and certain electron microscopy sites. Bandlimited protection, as is known in the prior art, uses sensors of high sensitivity and relatively low cost, but limited low frequency response of approximately 1 Hz low frequency cutoff. In contrast, the feedback enhanced sensor is well suited for the latter application example which requires a sensor with a "near-d.c." magnetic field response and a low noise floor. Typically, fluxgate magnetometer pickups would be selected for this class of service at higher total system cost.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. An active sensor system for detecting a time-varying magnetic field, comprising:
   a) a coil assembly having a ferromagnetic core; and
   b) an operational amplifier operatively connected to said coil assembly, said operational amplifier having a positive feedback path to substantially cancel the combined dissipative loss of resistance and core eddy currents of said coil assembly, and incorporating a capacitively reactive element in said positive feedback path to inhibit direct current offset and increase attenuation at excitation frequencies below a cut-off value, and a negative feedback path to control the composite gain of said active sensor system, whereby said active sensor system is operative in an approximate frequently range of between 0.001 Hz to 10 KHz.

2. The active sensor for detecting a time-varying magnetic field in accordance with claim 1, wherein said coil assembly comprises:
   i) a pickup coil wound and mounted on said ferromagnetic core; and
   ii) a flexible substrate adapted to avoid stressing said ferromagnetic core when said coil assembly is flexed.

3. The active sensor for detecting a time-varying magnetic field in accordance with claim 2, wherein said core is laminated.

4. The active sensor for detecting a time-varying magnetic field in accordance with claim 3, said coil assembly further comprising output leads extending from said pickup coil, said output leads being connected to conductors of a coaxial cable.

5. The active sensor for detecting a time-varying magnetic field in accordance with claim 4, wherein the sheath of said coaxial cable is grounded to said core laminations.

6. The active sensor for detecting a time-varying magnetic field in accordance with claim 5, wherein said core comprises thin strips of laminated high-permeability alloy.

7. The active sensor for detecting a time-varying magnetic field in accordance with claim 6, wherein said alloy comprises an amorphous crystalline structure.

8. An active, multi-channel sensor for detecting a time-varying magnetic field, comprising a plurality of coil assemblies with amplifiers, each of which is characterized by:
   a) a coil assembly having a ferromagnetic core; and
   b) amplifying means operatively connected to said coil assembly, said amplifying means having a negative effective input impedance to substantially eliminate the combined dissipative losses of coil and lead resistance and ferromagnetic core eddy currents of said coil assembly, said amplifying means further comprising a solid-state preamplifier having both a positive and a negative feedback path, said positive feedback path having a capacitively reactive element, whereby the sensitivity of the active sensor is determined by the negative feedback loop and negative effective input impedance is determined by the positive feedback loop, said amplifying means having an enhanced attenuation rate in a low-frequency stopband to mitigate alternating current magnetic field saturation effects, and further wherein said active, multi-channel sensor is operative within an approximate frequency range of between 0.001 Hz to 10 KHz.

9. The active sensor for detecting a time-varying magnetic field of claim 8, wherein said solid-state preamplifier comprises a low-noise operational amplifier having both a positive and a negative feedback path, whereby the sensitivity of the active sensor is determined by the negative feedback loop, and the negative effective input impedance and low-frequency magnitude and phase transfer characteristic are determined by the positive feedback loop.

10. The active sensor for detecting a time-varying magnetic field of claim 8, wherein said coil assembly comprises:
   i) a pickup coil wound and mounted on said ferromagnetic core; and
   ii) a flexible substrate adapted to avoid mechanically stressing said ferromagnetic core when said coil assembly is flexed.

11. The active sensor for detecting a time-varying magnetic field of claim 10, wherein said core is laminated.

12. The active sensor for detecting a time-varying magnetic field of claim 11, said coil assembly further comprising output leads extending from said pick-up coil, said leads being conductors of a cable.

13. The active sensor for detecting a time-varying magnetic field of claim 12, wherein said cable comprises a coaxial cable and wherein at least one shield of said coaxial cable is grounded to said core laminations.

14. The active sensor for detecting a time-varying magnetic field of claim 12, wherein said cable comprises a coaxial cable and wherein at least one shield of said coaxial cable is connected to said core laminations, said at least one shield being at an electrical potential other than ground potential.

15. The active sensor for detecting a time-varying magnetic field of claim 10, wherein said core comprises at least one thin strip of laminated high-permeability alloy.

16. The active sensor for detecting a time-varying magnetic field of claim 15, wherein said high-permeability alloy comprises an amorphous crystalline structure.

* * * * *